(12) United States Patent
Suzuki et al.

(10) Patent No.: US 6,515,544 B1
(45) Date of Patent: Feb. 4, 2003

(54) MULTI-TERMINAL POWER COMBINING FEED-FORWARD AMPLIFIER

(75) Inventors: Yasunori Suzuki, Yokohama (JP); Tetsuo Hirota, Tokyo (JP); Toshio Nojima, Yokosuka (JP)

(73) Assignee: NTT DoCoMo, Inc., Tokyo (JP)

( * ) Notice: Subject to any disclaimer, the term of this patent is extended or adjusted under 35 U.S.C. 154(b) by 0 days.

(21) Appl. No.: 09/850,733

(22) PCT Filed: Sep. 14, 2000

(86) PCT No.: PCT/JP00/06316
§ 371 (c)(1),
(2), (4) Date: May 17, 2000

(87) PCT Pub. No.: WO00/29410
PCT Pub. Date: May 25, 2000

(30) Foreign Application Priority Data

Sep. 17, 1999  (JP) ............................................ 11-263528

(51) Int. Cl.[7] ................................................. H03F 1/00
(52) U.S. Cl. ..................... 330/151; 330/149; 330/124 R
(58) Field of Search ............................. 330/124 R, 149, 330/151, 295

(56) References Cited

U.S. PATENT DOCUMENTS

| 4,618,831 A | 10/1986 | Egami et al. ............ 330/124 R |
| 5,055,798 A | 10/1991 | Heinzelmann ............... 330/295 |
| 6,011,434 A * | 1/2000 | Sakai ......................... 330/151 |

FOREIGN PATENT DOCUMENTS

| EP | 405 372 | 1/1991 |
| EP | 466 123 | 1/1992 |
| EP | 552 059 | 7/1993 |
| JP | 1-198809 | 8/1989 |
| JP | 4-274619 | 9/1992 |
| JP | 10-209777 | 8/1998 |

* cited by examiner

Primary Examiner—Michael B Shingleton
(74) Attorney, Agent, or Firm—Oblon, Spivak, McClelland, Maier & Neustadt, P.C.

(57) ABSTRACT

A feed-forward amplifier configuration $40_n$ having a distortion detector circuit and a distortion canceller circuit is formed between an input port $Ip_n$ and an output port $OP_n$ of a multi-terminal power-combining power amplifier with a main amplifier 4M provided for each channel between an input-side multi-terminal power combiner 3 and an output-side multi-terminal power combiner 5.

11 Claims, 8 Drawing Sheets

MULTI-TERMINAL POWER COMBINING FEED-FORWARD AMPLIFIER

TECHNICAL FIELD

The present invention relates to a multi-terminal power-combining power amplifier for amplifying a plurality of transmission signals and, more particularly, to a multi-terminal power-combining power amplifier suitable for use in an array antenna.

PRIOR ART

For example, U.S. Pat. No. 4,618,831 discloses a multi-terminal power-combining power amplifier as a power amplifier that is loaded on a satellite for multi-beam communication use. FIG. 1 depicts the basic construction of a multi-terminal power-combining power amplifier 10 that is what is called a multi-port amplifier.

The multi-terminal power-combining power amplifier 10 is comprised of an input-side multi-terminal power combiner 3 formed by a plurality of hybrids, a plurality of main amplifiers 4M, and an output-side multi-terminal power combiner 5 corresponding to the input-side multi-terminal power combiner. As is the case with a 4-input-4-output type depicted in FIG. 2, the input-side multi-terminal power combiner 3 is formed by a combination of plural $\pi/2$ hybrids HB. The output-side multi-terminal power combiner 5 also has the same construction as mentioned above. In general, the relationship between the number P of ports and the number m of stages of the hybrids is $P=m^2$.

The multi-terminal power-combining power amplifier 10 is used in combination with a multi-beam, adaptive array or similar array antenna. In the multi-beam and adaptive array antennas the beam power of each antenna element varies with traffic. At this time, the beam sending power rises to a maximum value during a full traffic period; there is the possibility that sending power of all antenna elements at a maximum centers on one antenna element. For example, assuming that the maximum sending power of one element is 1 W and the number of elements eight, one element may be supplied with power of a maximum of 8 W. Accordingly, the saturation output of the amplifier for each element of the array antenna needs to be designed with the full traffic period in mind. On this account, the use of discrete amplifiers inevitably makes the array antenna bulky.

In contrast thereto, when the multi-terminal power-combining power amplifier 10 is used in the array antenna, even if the traffic varies between beams, the power of the input signal to, for example, an input terminal $IP_1$ is equally divided by the multi-terminal power combiner 3 to all of its output terminals, and the thus divided signals are provided via the main amplifiers 4M to the output-side multi-terminal power combiner 5, wherein they are combined for output to an output terminal $OP_1$ of the same channel as the above-mentioned input terminal; therefore, the amounts of electrical power that are input to the respective main amplifiers 4M are ideally equal to one another at all times. This enables the saturation power of each amplifier to be designed setting the assumed saturation power for the full traffic period to a fraction of the number of terminals. Accordingly, the multi-terminal power-combining power amplifier 10 has the advantage of reducing the saturation power of each amplifier more than in the case of providing a discrete amplifier for each element of the array antenna. Thus the application of the multi-terminal power-combining power amplifier to the array antenna is effective.

As described in Egami, Kawai, et al., "Multi-terminal power-combining Multi-Beam Transmission System," IEICEJ Journal B, Vol.J69-B, No. 2, 1986, February, however, the multi-terminal power-combining power amplifier is required to have the following characteristics. First, the $\pi/2$ hybrids of the multi-terminal power combiner are uniform in electrical characteristic and low-loss; second, the main amplifiers are uniform in electrical characteristic. Variations of these characteristics cause power leakage between output ports of the power amplifier 10. Of such technical problems, it is relatively easy to form $\pi/2$ hybrids with suppressed characteristic variations and with high precision, but it is appreciably difficult to make the electrical characteristics of the main amplifiers uniform.

As described in the paper by Egami et al., assuming that the isolation between the ports of the multi-terminal power-combining power amplifier is 30 dB and that the number of ports is eight, it is necessary that a standard deviation of the gain of the main amplifier be 0.7 dB or less and that a standard deviation of the amount of phase be 5 degrees or less. It is difficult to fabricate and adjust a number of main amplifiers so that they meet such conditions of standard deviations, taking into account device temperature variations and aging.

An object of the present invention is to provide a multi-terminal power-combining power amplifier that permits implementation of a high inter-port isolation regardless of device temperature variations and aging.

DISCLOSURE OF THE INVENTION

According to the present invention, a feed-forward multi-terminal power-combining power amplifier comprises: a multi-terminal power-combining power amplifier provided with input and output ports of a plurality of channels and having main amplifiers that output amplified transmission signals as main signals to the respective channels; and feed-forward amplifier circuits each formed between the input and output ports of one of the plurality of channels and including the corresponding one of the main amplifiers, for removing a distortion component in the main signal from the corresponding main amplifier.

Since distortion of the main amplifier of each channel is removed by the characteristic of the feed-forward amplifier and characteristics of the devices used are made uniform, leakage power between the ports can be reduced.

BEST MODE FOR CARRYING OUT THE INVENTION

Basic Construction

Figure 1:
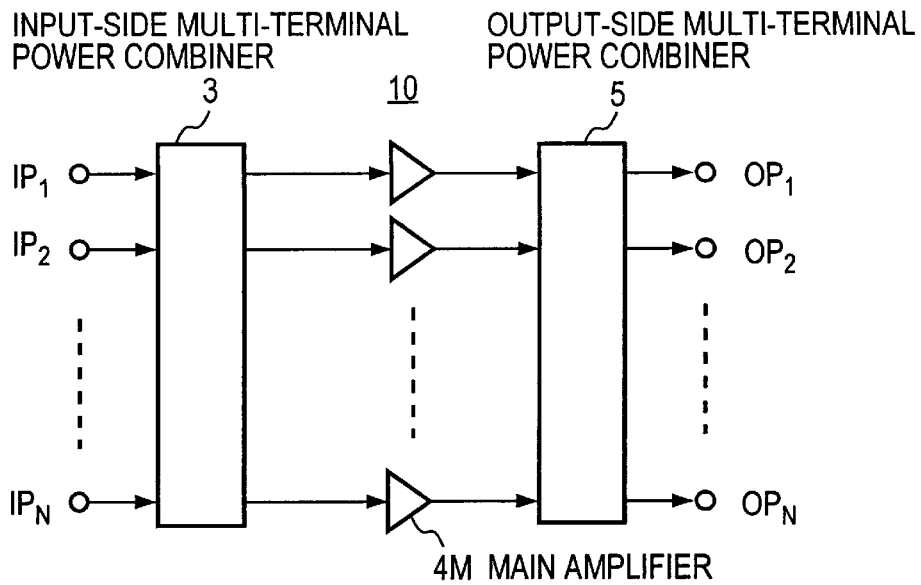
FIG. 1 is a diagram illustrating the construction of a multi-terminal power-combining power amplifier.
Figure 2:
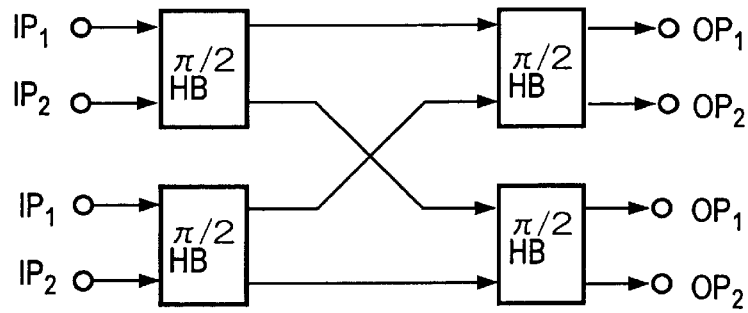
FIG. 2 is a diagram depicting an example of a multi-terminal power combining circuit using hybrids.
Figure 3:
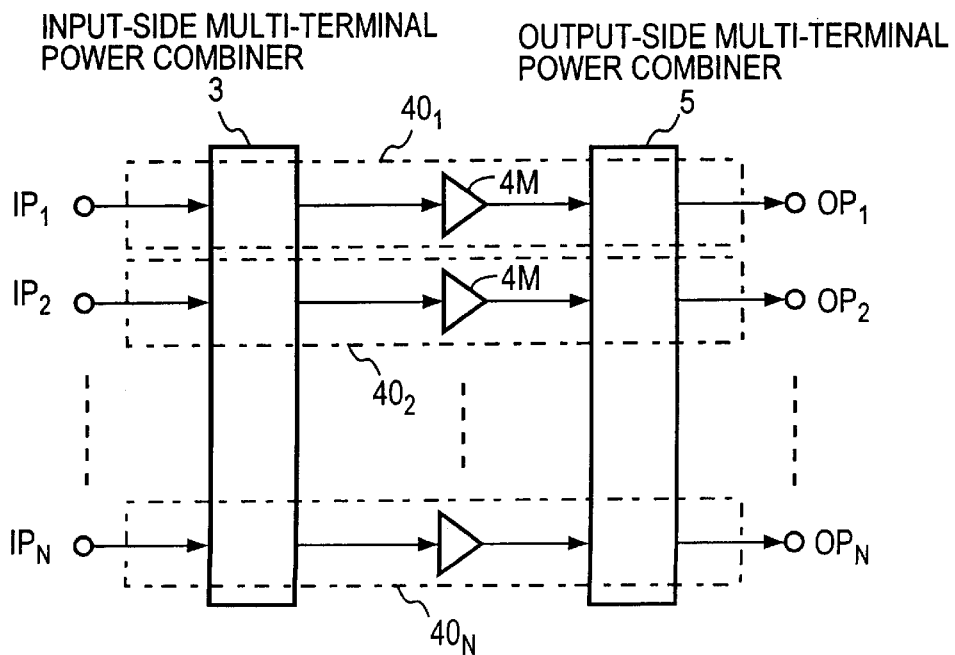
FIG. 3 is diagram showing the basic construction of a multi-terminal power-combining power amplifier according to the present invention.

In FIG. 3 there is depicted the basic construction of the feed-forward multi-terminal power-combining power amplifier according to the present invention. According to the present invention, in the conventional multi-terminal power-combining power amplifier composed of the input-side multi-terminal power combiner 3, the main amplifiers 4M and the output-side multi-terminal power combiner 5 as shown in FIG. 1 there is formed between input and output ports $Ip_n$ and $Op_n$ of each channel a feed-forward amplifier circuit $40_n$ that contains the main amplifier 4M.

In the multi-terminal power-combining power amplifier a power leakage occurs between the ports due to variations in the electrical characteristics of the hybrids and the main amplifiers. On this account, interference occurs between the ports, and as a result, the beam directivity provided by the array antenna does not become as initially designed. To keep the beam directivity as designed, it is necessary to minimize the isolation between the ports. This requires reduction of variations in the characteristics of the π/2 hybrids forming the main amplifiers and input- and output-side multi-terminal power combiners. The characteristics of the π/2 hybrids can be provided relatively easily with high precision. On the principles of the present invention, the feed-forward amplifier formed in association with the main amplifier for each channel is intended to reduce variations in the electrical characteristics of the main amplifier. This permits reduction of the power leakage between the ports, allowing an increase in the isolation between the ports.

First Embodiment

Figure 4:
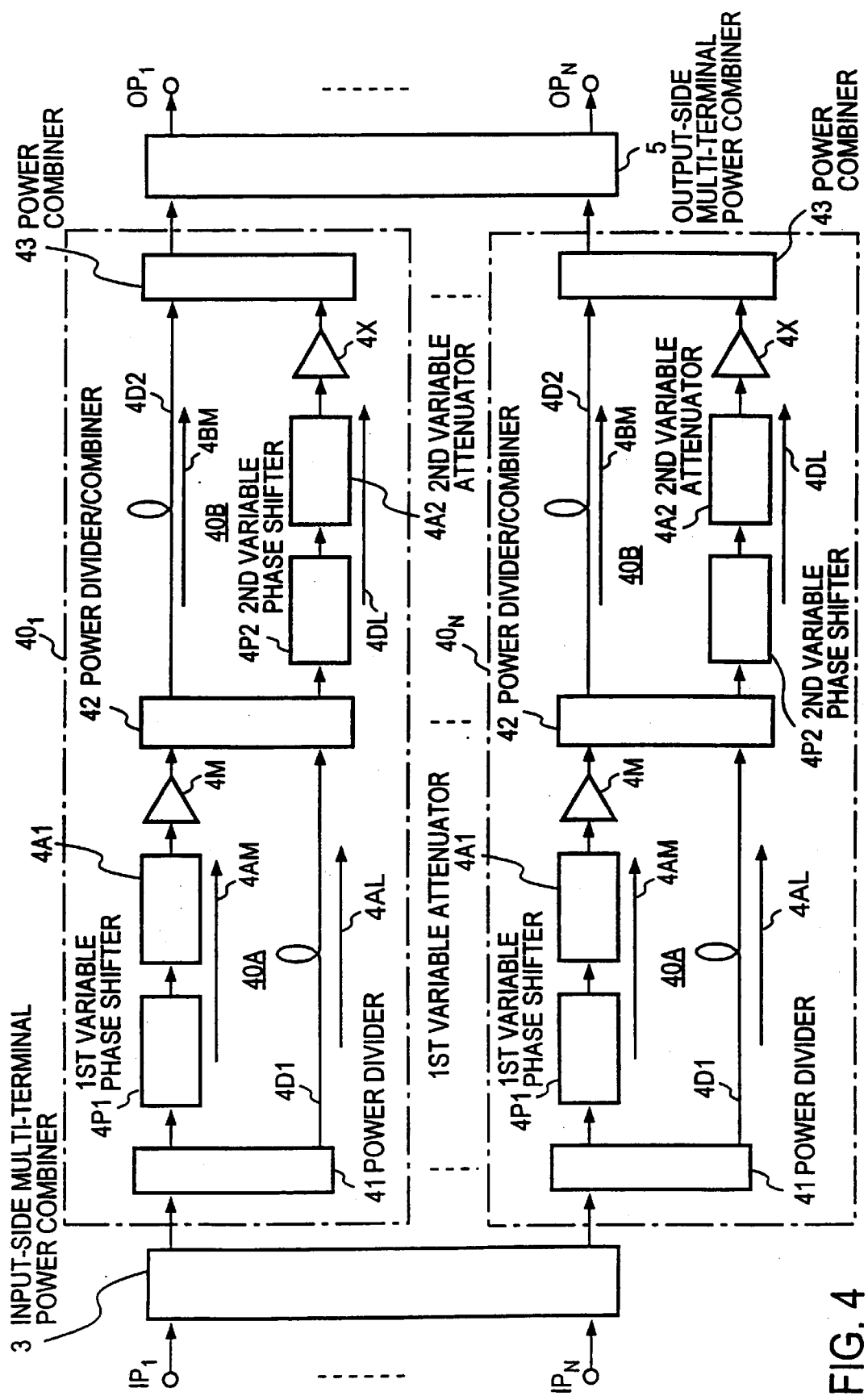
FIG. 4 is a diagram depicting a first embodiment of the present invention.

FIG. 4 illustrates a first embodiment of the present invention. In this embodiment, the feed-forward amplifier circuit $40_n$ in the basic construction of the present invention depicted in FIG. 3 is provided between the input- and output-side multi-terminal power combiners 3 and 5 in correspondence with each port. That is, in the first embodiment the feed-forward multi-terminal power-combining power amplifier is comprised of: the input-side multi-terminal power 3 that has N- channel input terminals $IP_1, \ldots, IP_N$ and performs combining and dividing N-channel input power; N-channel independent feed-forward amplifier circuits $40_1, \ldots, 40_N$ connected to N output terminals of the input-side multi-terminal power combiner 3; and the output-side multi-terminal power combiner 5 having its input terminals connected to output terminals $OP_1, \ldots, OP_N$ of the N-channel feed-forward amplifier circuits $40_1, \ldots, 40_N$ respectively.

Each feed-forward amplifier $40_n$ shown in FIG. 4 has delay lines 4D1 and 4D2 in the distortion detector circuit 40A and the distortion canceller circuit 40B, respectively. In the distortion detector circuit 40A and the distortion canceller circuit 40B the power divider/combiner 42 and the power combiner 43 combine signals from the respective paths 4AM, 4AL and 4BM, 4DL, respectively, after they each adjust the amplitude and phase of the signal in one of the two signal paths so that the signals from the both signal paths are equal in amplitude and equally delayed but 180 out of phase with each other. The accuracies of adjustments to the amplitude and phase determine the degree of equilibrium of the loops of the distortion detector circuit 40A and the distortion canceller circuit 40B. As set forth in Japanese Patent Application Laid-Open Gazette No. 1-198809 "Automatic Adjustment Control Circuit of Feed-Forward Amplifier," the suppression of a distortion, for example, exceeding 30 dB requires achieving the degree of loop equilibrium such that the amplitude and phase deviations are ±0.3 dB and ±2 degrees, respectively.

The linear signal path 4DA and the main signal path 4BM are merely delay lines each formed by a cable, and the power divider 41, the power divider/combiner 42 and the power combiner 43 are formed, for example, by directional couplers or hybrids. By adjusting the first variable attenuator 4A1 and the first variable phase shifter 4P1 relative to the linear signal path 4AL of the distortion detector circuit 40A, a main signal component is canceled at the output side of power divider 42 to the distortion injecting path 4DL so that only a nonlinear distortion component (a difference component) by the main amplifier 4M remains uncanceled, thereby keeping the loop of the distortion detector circuit 40A in equilibrium. Similarly, the second variable attenuator 4A2 and the second variable phase shifter 4P2 are adjusted relative to a signal on the main signal path 4BM of the distortion canceller circuit 40B to cancel a nonlinear distortion component of the main amplifier 4M at the output side of the power combiner 43 so that only the main signal component remains unremoved, thereby keeping the loop of the distortion canceller circuit 40B in equilibrium. The feed-forward amplifier circuit itself, which is used to cancel the nonlinear distortion of the main amplifier 4M, is a well-known technique.

Next, a description will be given of uniformity of electrical characteristics of the feed-forward multi-terminal power-combining power amplifier.

Each feed-forward amplifier $40_n$ shown in FIG. 4 has delay lines 4D1 and 4D2 in the distortion detector circuit 40A and the distortion canceller circuit 40B, respectively. In the distortion detector circuit 40A and the distortion canceller circuit 40B the power divider/combiner 42 and the power combiner 43 combine signals from the respective paths 4AM, 4AL and 4BM, 4DL, respectively, after they each adjust the amplitude and phase of the signal in one of the two signal paths so that the signals from the both signal paths are equal in amplitude and equally delayed but 180 degrees out of phase with each other. The accuracies of adjustments to the amplitude and phase determine the degree of equilibrium of the loops of the distortion detector circuit 40A and the distortion canceller circuit 40B. As set forth in Japanese Patent Application Laid-Open Gazette No. 1-198809 "Automatic Adjustment Control Circuit of Feed-Forward Amplifier," the suppression of a distortion, for example, exceeding 30 dB requires achieving the degree of loop equilibrium such that the amplitude and phase deviations are ±0.3 dB and ±2 degrees, respectively.

The delay line forming the linear signal path 4AL is a cable that interconnects the power divider 41 and the power divider/combiner 42, and since the amount of delay depends on the cable length, variations in the amount of delay, that is, variations in the cable length, can be greatly reduced. The first variable phase shifter 4P1 needs only to be adjusted with reference to the delay line 4D1, and hence it can also be set with high accuracy. In the actual adjustment for the loop equilibrium, as will be described later on with reference to an embodiment of FIG. 5, the loop equilibrium can be adjusted with high accuracy by using a first pilot signal for phase and amplitude adjustments—this makes it relatively easy to keep the phase and amplitude deviations of the loop within ±2 degrees and ±0.3 dB, respectively. The loop equilibrium of the distortion canceller circuit 40B, too, can similarly be adjusted by adjusting the second variable phase shifter 4P2 together with the second variable attenuator 4A2 with reference to the main signal path formed by a delay line; hence, it is possible to make high-accuracy loop equilibrium adjustment with the phase and amplitude deviations held within ±2 degrees and ±0.3 dB, respectively, by using a second pilot signal as will be described later on in respect of the FIG. 5 embodiment.

As described above, the use of the feed-forward configuration for the respective main amplifiers is effective in achieving uniform electrical characteristics of the plural main amplifiers in the multi-terminal power-combining power amplifier.

It can easily be understood from the FIG. 4 configuration of the feed-forward amplifier that its phase characteristic depends on the working accuracy of the delay lines 4D1 and 4D2 forming the distortion detector circuit 40A, and the distortion canceller circuit 40B. Further, since the main signal is cancelled in the distortion detector circuit 40A with reference to the transmission signal in the delay line 4D1 to detect the distortion component, it can readily be seen that gain characteristics of the plural feed-forward amplifiers can be made uniform when input signals to the feed-forward amplifiers are equal in level.

Thus the electrical characteristics of plural independent main amplifiers can be made uniform by configuring them as feed-forward amplifiers.

Through utilization of such a feed-forward configuration the present invention permits implementation of a multi-terminal power-combining power amplifier of high inter-port isolation conventionally difficult to realize. This means realization of an ideal multi-terminal power-combining power amplifier without nonuniform electrical characteristics of individual amplifiers.

Second Embodiment

Figure 5:
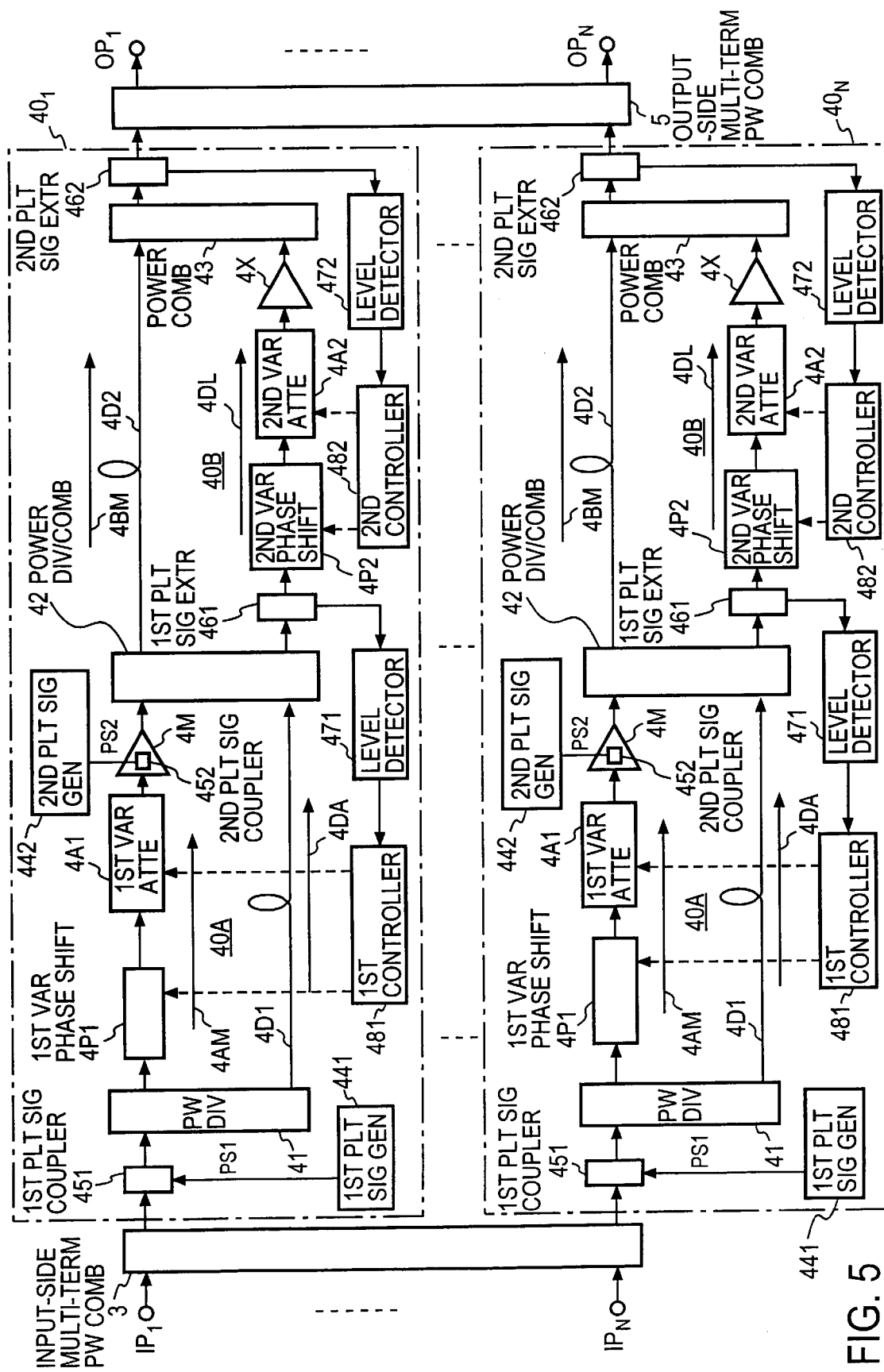
FIG. 5 is a diagram depicting a second embodiment of the present invention.

FIG. 5 illustrates a second embodiment of the present invention.

The loops of the distortion detector circuit 40A and the distortion canceller circuit 40B in the feed-forward amplifier circuit $40_n$ undergo variations in the degree of equilibrium. This is because the conditions for equilibrium of the loops readily change with load and temperature variations and aging of the circuits. A solution to this problem is an automatic adjustment control circuit that achieves equilibrium of a loop of the feed-forward configuration using a pilot signal (Japanese Patent Application Laid-Open Gazette No. 1-198809: Automatic Adjustment Control Circuit of Feed-Forward Amplifier). According to this prior art, a pilot signal is injected into each loop and detected, and equilibrium of the loop is achieved by adjusting the variable phase shifter and the variable attenuator in such a manner as to minimize the level of the detected pilot signal. There has been put to practical use a power amplifier of a base station for mobile communication systems that uses this method (Shoichi Narahashi and Toshio Nojima, "Extremely Low-Distortion Multi-Carrier Amplifier for Mobile Communication Systems," Technical Report of IEICEJ Radio Communication Systems Study Group, RCS90-4, 1990).

This second embodiment also uses pilot signals to easily achieve equilibrium of the loop of the feed-forward configuration. With a view to correcting for degradation of the loop equilibrium by aging that is peculiar to the feed-forward structure, the second embodiment uses first and second pilot signals in the feed-forward amplifier circuit $40_n$ in the FIG. 4 embodiment to allow ease in correcting the equilibrium of the loops of the distortion detector circuit 40A and the distortion canceller circuit 40B. The method for achieving the equilibrium of loop by using pilot signals is disclosed in the before-mentioned Japanese Patent Application Laid-Open No. 1-198809 or U.S. Pat. No. 5,166,634. The present invention achieves the equilibrium of loops through the use of the same control method as set forth in the prior art literature.

A first pilot signal coupler 451 by a hybrid or directional coupler is provided at the input of the feed-forward amplifier $40_n$, and a first pilot signal PS1 generated by a first pilot signal generator 441 is provided via the first pilot signal coupler 451 to the feed-forward amplifier $40_n$. The first and second pilot signal generators 441 and 442 are formed by oscillators using a method that employs CW disclosed, for example, in U.S. Pat. No. 5,166,634 (patent application Ser. No. 23574/88 entitled "Automatic Adjustment Control Circuit of Feed-Forward Amplifier"), a method that employs a narrow-band modulated wave (patent application Ser. No. 259440/91 entitled "Feed-Forward Interference Circuit"), or a method that employs a spread-spectrum wave (patent application Ser. No. 140349/91 entitled "Feed-Forward Interference Circuit"). A second pilot signal coupler 452, which is formed by a hybrid or directional coupler as is the case with the first pilot signal coupler 451, is inserted in the main amplifier 4M. A first pilot signal extractor 461 is implemented by a hybrid or directional coupler, and is inserted in the distortion injecting path 4DL. A second pilot signal extractor 462 is implemented by a hybrid or directional coupler, and is connected to the output side of the power combiner 43.

The level of the first pilot signal PS1 is detected by a level detector 471, from which it is fed to a first controller 481. The first controller 481 controls stepwise the first variable phase shifter 4P1 and the first variable attenuator 4A1 of the main signal path 4AM in such a manner as to minimize the level of the first pilot signal PS1. This makes it possible to achieve the equilibrium of the loop of the distortion detector circuit 40A. The level of a second pilot signal PS2, extracted by the second pilot signal extractor 462, is detected by a level detector 472, from which it is fed to a second controller 482. The second controller 482 controls stepwise the second variable phase shifter 4P2 and the second attenuator 4A2 of the distortion injecting path 4DL in such a manner as to minimize the level of the second pilot signal PS2. This makes it possible to achieve the equilibrium of the loop of the distortion canceller circuit 40B. Such control for loop equilibrium may be effected periodically or as required. While in the above the first and second controllers 481 and 482 have been described to be used to carry out the equilibrium control for the loops of the distortion detector circuit 40A and the distortion canceller circuit 40B, respectively, the equilibrium control for the loops can be effected by one controller.

Figure 7:
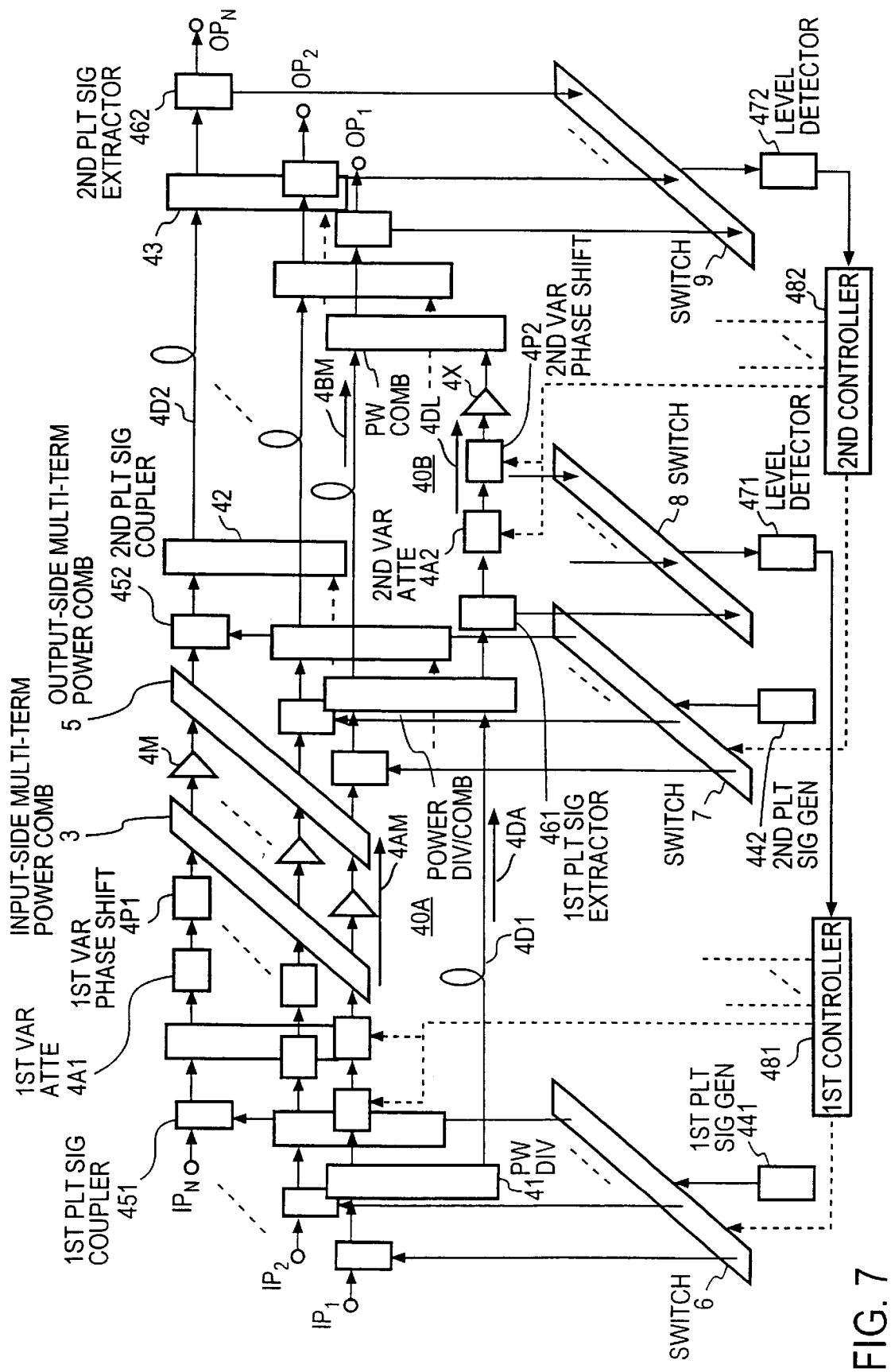
FIG. 7 is a diagram depicting a fourth embodiment of the present invention.

Incidentally, while the FIG. 5 embodiment has been described to use the first and second pilot signal generators 441 and 442, the first and second level detectors 471 and 472 and the first and second controllers 481 and 482 specifically for each feed-forward amplifier circuit $40_n$ alone, it is also possible to employ a structure in which the first and second pilot signal generators 441, 442 and the first and second level detectors 471, 472 are provided one by one in common to all the channels and the first and second pilot signal generators 481, 482 and the first and second level detectors 471, 472 are selectively connected via switches to the first and second pilot signal couplers 451, 452 and the first and second pilot signal extractors 461, 462 of a desired channel as will be described later on with reference to an embodiment of FIG. 7. Based on the detected levels by the first and second level detectors 471 and 472, the first and second controllers 481 and 482 control the first and second variable attenuators 4A1, 4A2 and the first and second variable phase shifters 4P1, 4P2 of all the channels.

In this way, the distortion-suppressing characteristic of the feed-forward amplifier $40_n$ can be obtained stably. Further, variations in the electrical characteristics of the plural independent main amplifiers 4M can easily be reduced. And it can readily be inferred that the same results as mentioned above could be obtained even by applying to the present invention various distortion compensating techniques for the feed-forward amplifier and techniques for increasing the sensitivity of pilot signals.

According to the first and second embodiments described above, the present invention has such advantages as simplifying the adjustment to the feed-forward multi-terminal power-combining power amplifier, preventing deviations of its electrical characteristics by aging and temperature changes, and exerting no influence on the formation of beams of the array antenna.

Third Embodiment

Figure 6:
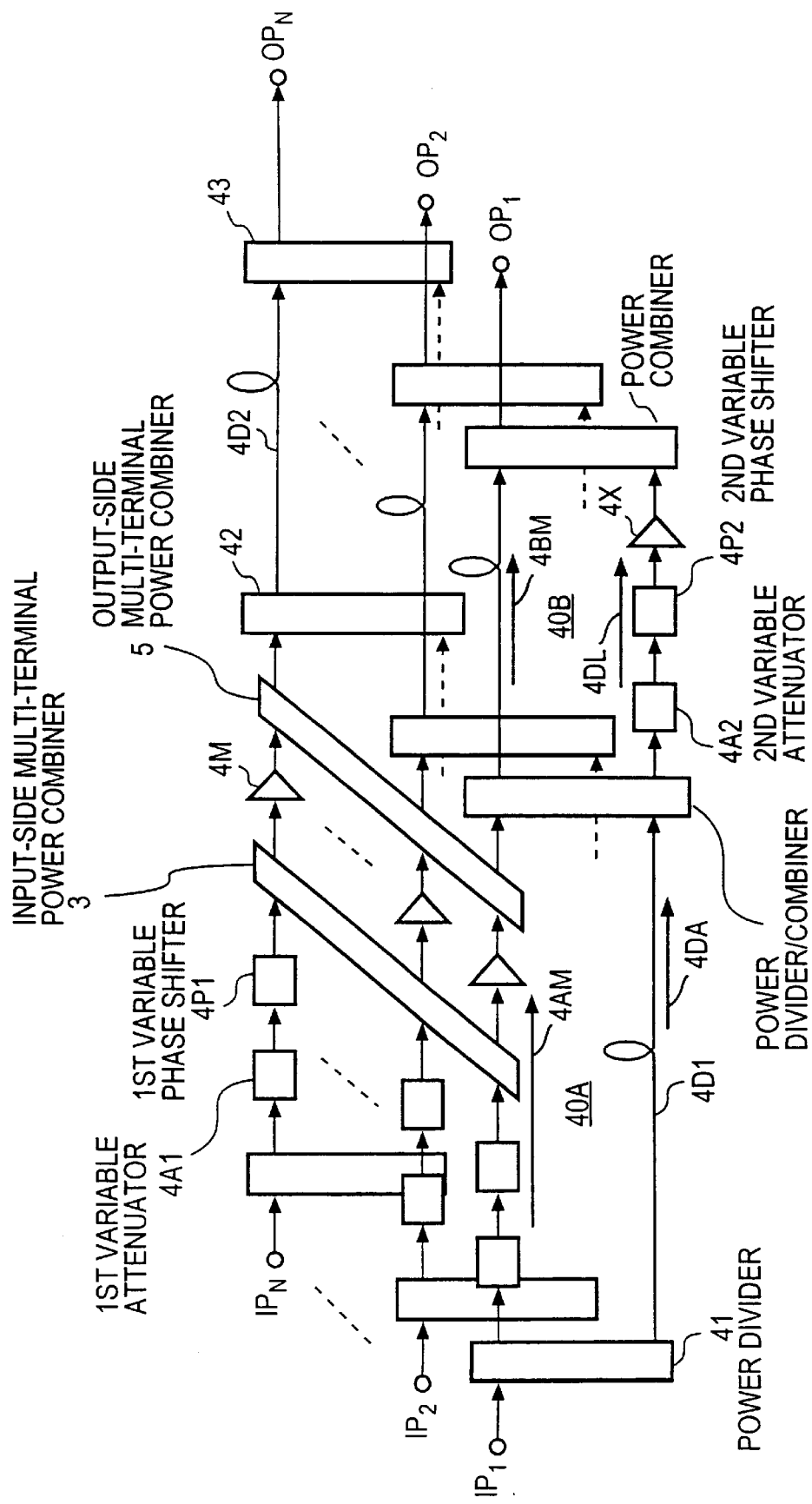
FIG. 6 is a diagram depicting a third embodiment of the present invention.

FIG. 6 illustrates a third embodiment of the present invention. In the first and second embodiments the feed-forward amplifier circuit $40_n$ containing the main amplifier 4M is formed between the input- and output-side multi-terminal power combiners 3 and 5 in correspondence with each port in FIG. 3, but in the FIG. 6 embodiment each channel from the input port $Ip_n$ to the output port $Op_n$ via the main amplifier 4M in FIG. 3 constitutes, in its entirety, the feed-forward amplifier circuit $40_n$. More specifically, the FIG. 6 embodiment has a construction in which, in the FIG. 4 embodiment, the input-side multi-terminal power combiner 3 is placed at the input side of the main amplifiers 4M of all the channels and the output-side multi-terminal power combiner 5 at the output side of the main amplifiers 4M of all the channels; but this embodiment is identical with the FIG. 4 embodiment except the above. Accordingly, the input signal from each input port $Ip_n$ is supplied to the power divider 41, and the signal of each channel is provided to the output port $Op_n$ from the output of the power combiner 43 of the feed-forward amplifier circuit $40_n$.

The transmission signal of each input port $Ip_n$ is fed to the power divider 41 of the feed-forward amplifier circuit $40_n$. The distortion detector circuit 40A is made up of: the power divider 41; the power divider/combiner 42; the main amplifier path 4AM from the power divider 41 to the power divider/combiner 42 via the first variable attenuator 4A1, the first variable phase shifter 4P1, the input-side multi-terminal power combiner 3, the main power amplifier 4M and the output-side multi-terminal power combiner 5; and the linear signal path 4DA from the power divider 41 to the power divider/combiner 42 via the delay line 4D1.

The power divider/combiner 42 divides/combines the output signals from the main amplifier path 4AM and the delay line 4D1, and outputs the sum component to the main signal path 4BM of the distortion canceller circuit and, as the difference component, the nonlinear distortion component of the main amplifier to the distortion injecting path 4DL. The distortion canceller circuit 40B is made up of: the main signal path 4D2 formed by the delay line from the power divider/combiner 42 to the power combiner 43; the distortion injecting path 4D1 from the power divider/combiner 42 to the power combiner 43 via the second variable attenuator 4A2, the second variable phase shifter 4P2 and the auxiliary amplifier 4X; and the power combiner 43.

The outputs from the main signal path 4BM and the distortion injecting path 4DL are power-combined by the power combiner 43, in consequence of which the distortion component in the output signal from the main signal path 4BM is removed be being combined with the output signal from the distortion injecting path that is equal in amplitude and in delay to but 180 degrees out of phase with the distortion component in the output signal from the main signal path 4BM.

What is characteristic of this embodiment is the construction wherein the main signal of the main amplifier path of each channel is divided to the main amplifiers 4M of all the channels by the input-side multi-terminal power combiner 3 placed at the input side of the main amplifiers 4M, and the outputs from the main amplifiers 4M are combined by the output-side multi-terminal power combiner 5, the power of the combined output being mostly provided to the power divider/combiner 42 of the corresponding channel and the remaining power being divided to the power divider/combiners 42 of the other channels. At this time, the power divider/combiner of the above-mentioned one channel is supplied with leakage power from the other channels, but the leakage power is detected, as a distortion, by the distortion detector circuit 40A forming the feed-forward amplifier circuit $40_n$, together with the nonlinear distortion by the main amplifier 4M, and it is cancelled by the distortion canceller circuit 40B.

That is, the power leakage between the ports, which is caused by characteristic variations of the power combiners 3 and 5 and the main amplifiers 4M of all the channels, is detected, as a distortion, by the respective distortion detector circuits 40A, and the distortion is cancelled by the power combiners 43. This is equivalent to the realization of an ideal feed-forward multi-terminal power-combining power amplifier in which variations in the electrical characteristics of the constituent components are very small and, consequently, the inter-port isolation is very high. Moreover, since the above-described configuration has no conditions imposed thereon concerning characteristic variations of the main amplifier 4M, it is possible to use an amplifier that is low-cost accordingly.

Fourth Embodiment

FIG. 7 depicts a modified form of the FIG. 6 embodiment, which is added with the structure for achieving the loop equilibrium in the distortion detector circuit 40A and the distortion canceller circuit 40B through utilization of the first and second pilot signals as described previously with reference to the FIG. 5 embodiment. In this embodiment: the first pilot signal coupler 451 is interposed between the input port $Ip_n$ of each channel and the power divider 41; the second pilot signal coupler 452 is interposed between each output of the output-side multi-terminal power combiner 5 and the input of each power divider/combiner 42; the first pilot extractor 461 is interposed in the distortion injecting path 4DL between the power divider/combiner 42 and the auxiliary amplifier 4X of each distortion canceller circuit 40B; and the second pilot signal extractor 462 is connected to the output side of each power combiner 43.

The levels of the first and second pilot signals from the first and second pilot signal generators 441 and 442 in the channel selected by switches 6 and 7 are detected by the first and second level detectors 471 and 472, and the level of the first and second pilot signals extracted by the pilot signal extractors 461 and 462 of a desired channel selected by switches 8 and 9 are detected by the first and second level detectors 461 and 462. The detected levels by the level detectors 471 and 472 are provided to the first and second controllers 481 and 482, which, based on the inputs thereto, control the first variable attenuator 4A1, the first variable phase shifter 4P1 and the second variable attenuator 4A2, the second variable phase shifter 4P2, respectively. The switches 6 and 8 are controlled by the first controller 481 to select the same channel in synchronization with each other, and the switches 7 and 9 are controlled by the second controller 482 to select the same channel in synchronization with each other.

The transmission signal at the input terminal $Ip_n$ is fed to the first pilot signal coupler 451. The first pilot signal coupler 451 couples the first pilot signal PS1 to a channel n. The output from the first pilot signal coupler 451 is applied to the power divider 41 of the feed-forward amplifier circuit $40_n$.

The power divider/combiner 42 divides/combines the output signals from the main amplifier path 4AM and the delay line 4D1, and outputs the sum component to the main signal path 4BM of the distortion canceller circuit 40B and outputs to the distortion injecting path 4DL, as a distortion, the nonlinear distortion component of the main amplifier that is the difference component and the inter-port leakage power. The second pilot signal coupler 452 injects the second pilot signal PS2 into a channel of the amplified transmission signal. The sum component output from the power divider/combiner 42 is provided onto the main signal path 4BM formed by a delay line, and the difference component output from the power divider/combiner 42 is provided onto the distortion injecting path 4DL formed by the first pilot signal extractor 461, the second variable attenuator 4A2, the second variable phase shifter 4P2 and the auxiliary amplifier 4X.

The outputs from the main signal path 4BM and the distortion injecting path 4DL are power-combined by the power combiner 43. That is, the distortion component in the output signal from the main signal path 4BM is removed by being combined with the output signal from the distortion injecting path that is equal in amplitude and delay to but 180 degrees out of phase with the output signal from the main signal path 4BM.

The first pilot signal PS1 is generated by the first pilot signal generator 441 composed of a signal generator for generating a tone or modulated wave and a frequency converter for converting it to a signal of a predetermined frequency. The first controller 481 controls the switches 6 and 8 to select a desired transmission channel, in consequence of which the first pilot signal PS1 is injected into the first pilot signal coupler 451 of the selected transmission channel, and the first pilot signal PS1 is extracted by the first pilot signal extractor 461 of the selected transmission channel from the distortion injecting path 4DL.

The first pilot signal PS1 extracted by the first pilot signal extractor 461 is applied to the first level detector 471, wherein its level is detected. The first level detector 471 is composed of a narrow-band filter, a frequency converter and a level detector when the first pilot signal PS1 is a tone signal. When the first pilot signal PS1 is a modulated wave, the first level detector is composed of a band-pass filter, a frequency converter, a detector, a decision means and a carrier synchronizing circuit. The level of the first pilot signal detected by the first level detector 471 is provided to the first controller 481, which controls stepwise the first variable attenuator 4A1 and the first phase shifter 4P1 in a manner to minimize the detected level of the input first pilot signal.

These control algorithms are implemented by a perturbation method, steepest descent method, or various adaptive algorithms conventionally put to practical use. The first controller 481 adjusts the variable attenuator 4A1 and the variable phase shifter 4P1 of the selected channel, then controls the switches 6 and 8 to select a different channel in which to inject the first pilot signal PS1, and adjusts the variable attenuator 4A1 and the variable phase shifter 4P1 of the selected channel. The first controller 481 follows a control procedure, by which it instructs the switches 6 and 8 to select channels in a predetermined order, then controls by one or more steps the variable attenuator 4A1 and the variable phase shifter 4P1 of the selected channel in a manner to minimize the detected level of the first pilot signal, and sends to the switches 6 and 8 a signal for selecting a different channel. In this way, the N channels are sequentially controlled.

Under the control of the second controller 482 the switches 7 and 9 select a predetermined channel, and the second pilot signal PS2 generated by the second pilot signal generator 442 is injected into the second pilot signal coupler 452 of the selected transmission channel. The second pilot signal PS2 extracted by the second pilot signal extractor 462 is provided to the second level detector 472, wherein the level of the second pilot signal is detected, and the detected level is provided to the second controller 472. The second level detector 472 is formed by a narrow-band filter, a frequency converter and a level detector when the second pilot signal PS2 is a tone signal. When the second pilot signal PS2 is a modulated wave, the second level detector is formed by a band-pass filter, a frequency converter, a detector, a decision means and a carrier synchronizing circuit. The second controller 482 controls stepwise the second variable attenuator 4A2 and the second variable phase shifter 4P2 in a manner to minimize the level of the input second pilot signal. These control algorithms are implemented by a perturbation method, steepest descent method, or various adaptive algorithms conventionally put to practical use. As is the case with the first controller 481, the second controller 482 adjusts the variable attenuator 4A2 and the variable phase shifter 4P2 of the selected channel, then controls the switches 7 and 9 to select a different channel, and adjusts the variable attenuator 4A2 and the variable phase shifter 4P2 of the selected channel.

With the arrangement described above, the first pilot signal PS1 is used to achieve the equilibrium of the feed-forward-structured distortion detector circuit 40A and the second pilot signal PS2 is used to achieve the equilibrium of the distortion canceller circuit 40B. And the loops of the feed-forward amplifier circuits are sequentially brought into the condition of equilibrium while switching the transmission channels by the controllers 481 and 482. By achieving the equilibrium of the loops of all the feed-forward amplifier circuits of the power amplifier, the electrical characteristics of all the transmission channels in the power amplifier can be made uniform. The first and second pilot signals used in the power amplifier of the present invention may be spread-spectrum signals spread by spreading codes.

Figure 8:
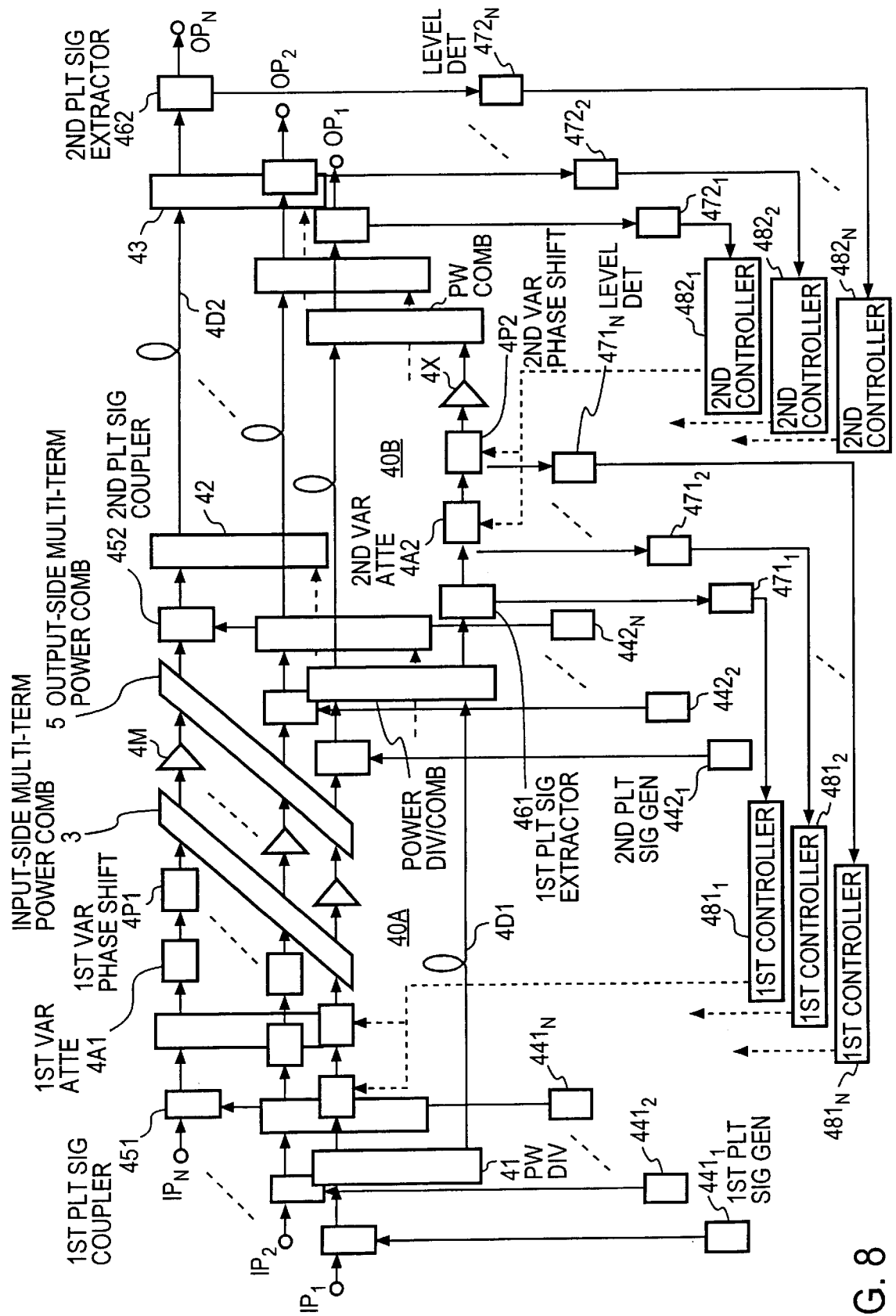
FIG. 8 is a diagram depicting a fifth embodiment of the present invention.

FIG. 8 illustrates a fifth embodiment of the present invention.

The FIG. 8 embodiment is a modified form of the fourth embodiment depicted in FIG. 6, in which the switches 6, 7, 8 and 9 are not used but instead first and second pilot signal generators ($441_1$ to $441_N$ and $442_1$ to $442_N$), first and second level detectors ($471_1$ to $471_N$ and $472_1$ to $472_N$) and first and second controllers ($481_1$ to $481_N$ and $482_1$ to $482_N$) are provided specifically for the respective channels. With such an arrangement, all the loops of the feed-forward amplifier circuits $40_1$ to $40_N$ of the entire transmission channel are simultaneously brought into the condition of equilibrium. The frequencies of the first and second pilot signals PS1 and PS2 are set to frequencies that avoid cross modulation attributable to the intermodulation distortion of amplifiers. Thus, the equilibrium of all the loops of the power amplifier is achieved, by which electrical characteristics of all the transmission channels can be made uniform.

Figure 9:
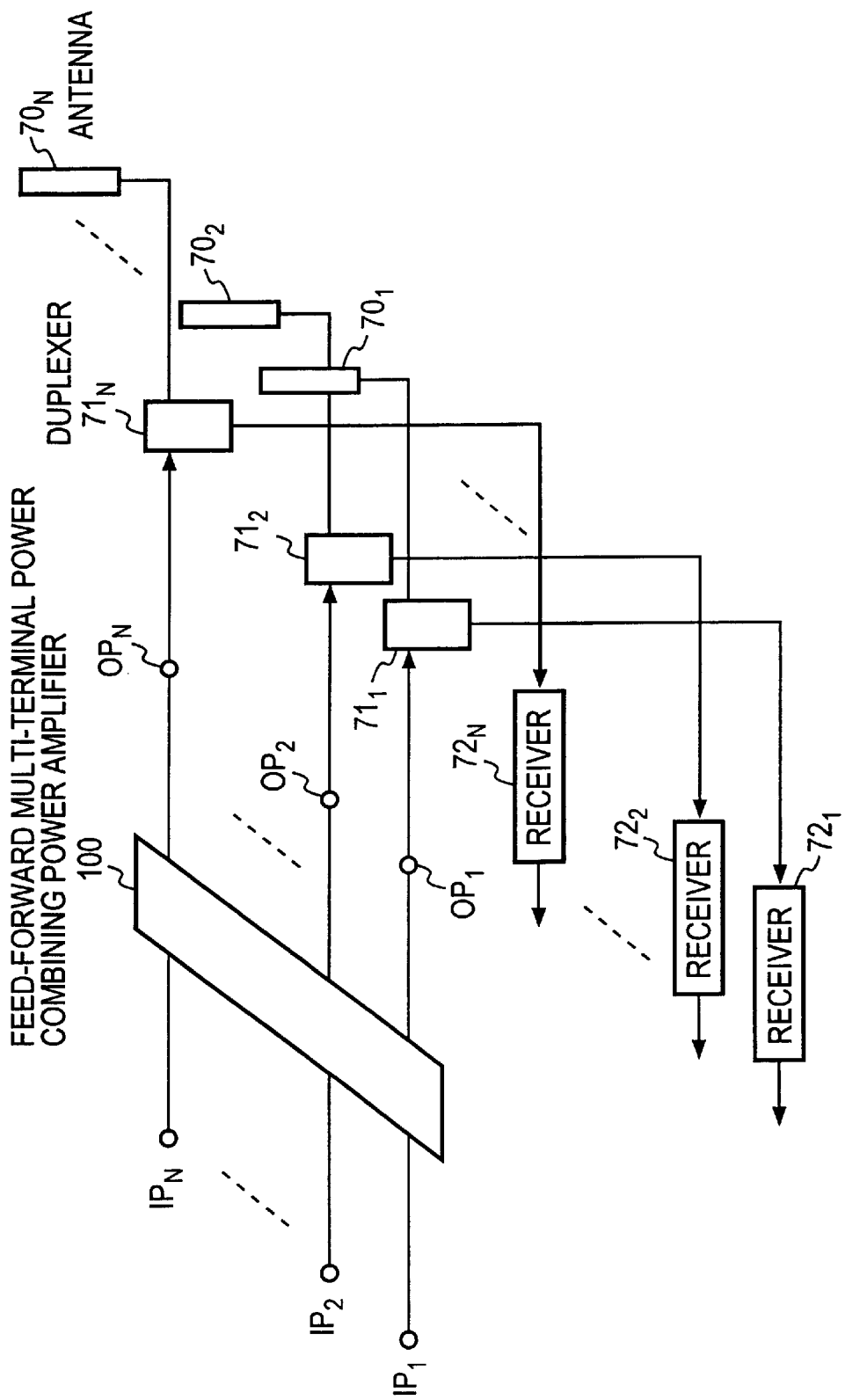
FIG. 9 is a diagram depicting a sixth embodiment of the present invention.

FIG. 9 illustrates a sixth embodiment of the present invention.

The FIG. 9 embodiment is directed to an application of the feed-forward multi-terminal power-combining power amplifier 100 of the present invention to an array antenna; this embodiment uses FDD (frequency division duplex), and different carrier frequencies are used for transmission and reception. The output channels $OP_1$ to $OP_N$ of the feed-forward multi-terminal power-combining power amplifier 100 of the present invention, shown in any one of FIGS. 3 to 8, are connected to duplexers $71_1$ to $71_N$, respectively. The duplexers $71_1$ to $71_N$ divide signals of different frequencies received by antennas $70_1$ to $70_N$ and transmission signals. The signals received by the antennas $70_1$ to $70_N$ are input via the duplexers $71_1$ to $71_N$ to receivers ($72_1$ to $72_N$). The receivers $72_1$ to $72_N$ perform predetermined signal processing. In this way, the feed-forward multi-terminal power-combining power amplifier 100 of the present invention can be combined with the array antennas $70_1$ to $70_N$.

The feed-forward multi-terminal power-combining power amplifier in FIG. 9 may be of the amplifier configuration shown in any of FIGS. 3 to 8.

Figure 10:
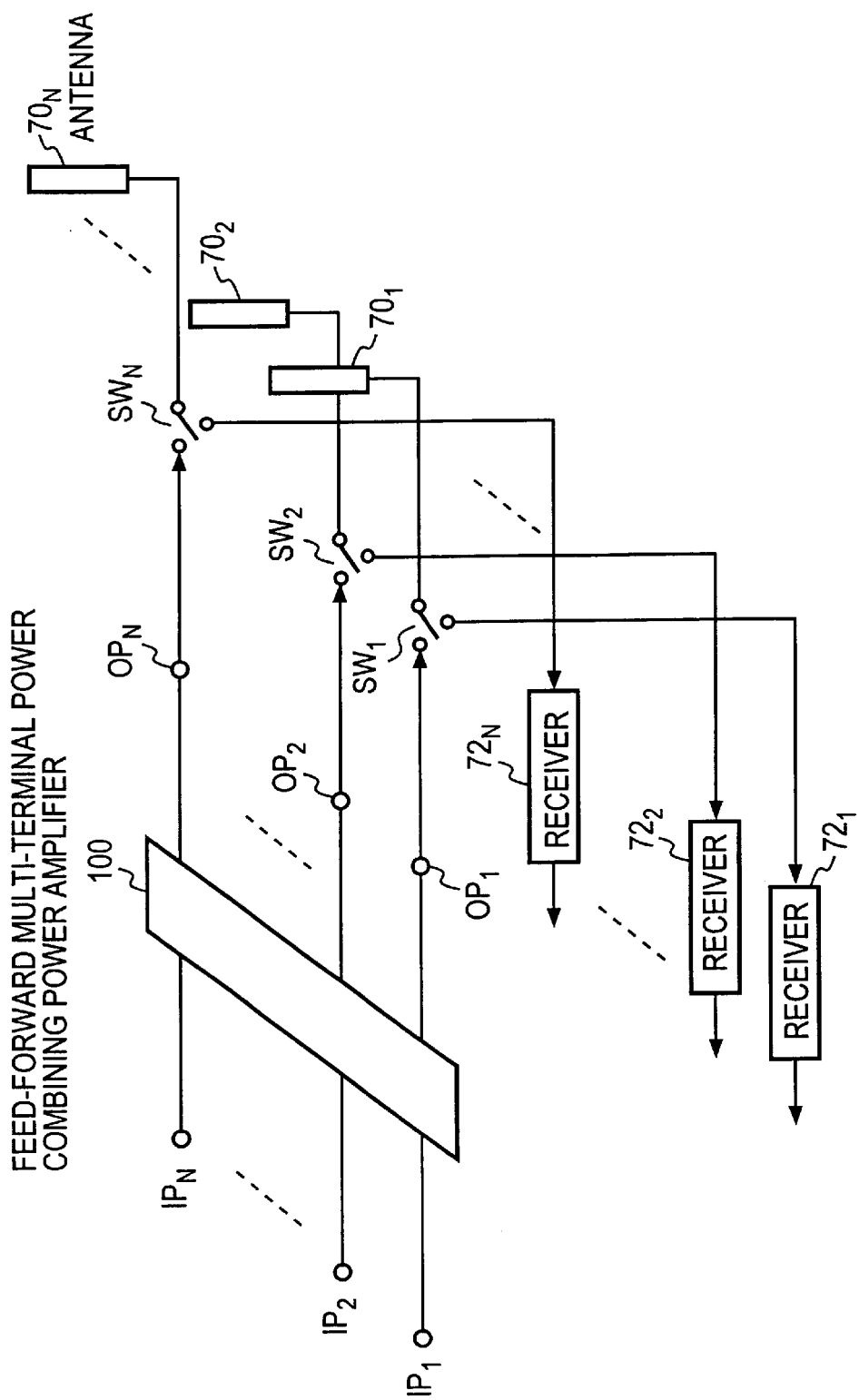
FIG. 10 is a diagram depicting a seventh embodiment of the present invention.

FIG. 10 illustrates a seventh embodiment of the present invention.

The FIG. 10 embodiment shows another example of the application of the feed-forward multi-terminal power-combining power amplifier 100 of the present invention to the array antenna. In this embodiment TDD (time division duplex) is used and the duplexers $71_1$ to $71_N$ in FIG. 9 are replaced with RF switches $SW_1$ to $SW_N$. In a transmission time slot the RF switches $SW_1$ to $SW_N$ are connected to the feed-forward multi-terminal power-combining power amplifier 100 and the transmission signal amplified b the amplifier 100 is sent via the antennas $70_1$ to $70_N$. In a reception time slot the RF switches $SW_1$ to $SW_N$ are connected to the receivers $72_1$ to $72_N$, and the received signal from the antennas $70_1$ to $70_N$ are supplied to the receivers $72_1$ to $72_N$. Thus, the power amplifier according to the present invention can be applied as a transmitting amplifier for the multi-beam and adaptive array antennas regardless of the radio communication system used.

EFFECT OF THE INVENTION

Because of the arrangements described above, the present invention produce the effects listed below.

(1) The electrical characteristics of plural independent main amplifiers can be made uniform.
(2) It is possible to obtain sufficiently stable electrical characteristics against temperature variations and aging of devices.
(3) Adjustments in manufacture is easy.
(4) By using the feed-forward configuration for each port, power leakage to other ports, which is caused by nonuniformity of electrical characteristics of the multi-terminal power combiners and each power amplifier, can be detected and removed together with the nonlinear distortion of each power amplifier.
(5) It is possible to offer a power amplifier that does not exert any influence on the beam formation of the array antenna.
(6) A power amplifier for array antenna use can be made small, economical and low in power consumption.

What is claimed is:

1. A feed-forward multi-terminal power-combining power amplifier comprising:
    a plurality of input terminals and output terminals corresponding to a plurality of channels;
    a plurality of feed-forward amplifier circuits corresponding to the plurality of channels;
    an input-side multi-terminal power combiner supplied with transmission signals from said input terminals, for power-combining and dividing said transmission signals for input to said plurality of feed-forward amplifier circuits; and
    an output-side multi-terminal power combiner for power-combining and dividing the outputs from said feed-forward amplifier circuits of said plurality of channels and outputting signals to said output terminals of said plurality of channels;
    wherein said feed-forward amplifier circuit of each of said channels comprises:
        a distortion detector circuit provided with a main amplifier, for detecting distortion component from the output of said main amplifier and for outputting said detected distortion component together with a main signal component from said main amplifier; and
        a distortion canceller circuit provided with an auxiliary amplifier that amplifies said detection distortion component, for canceling said distortion component in said main signal by said amplified distortion component;
    wherein said distortion detector circuit of said feed-forward amplifier circuit of said each channel comprises:
        a power divider for dividing the corresponding output from said input-side multi-terminal power combiner, for input to a first delay line and a main amplifier path;
        a first variable attenuator, a first variable phase shifter and said main amplifier interposed in series with said main amplifier path;
        a power divider/combiner supplied with the outputs from said main amplifier path and said first delay line, for power-dividing and combining said outputs and for outputting their sum and difference components as said main signal component and said distortion component, respectively; and
    wherein said distortion canceller circuit of said feed-forward amplifier circuit of said each channel comprises:
        a second delay line for transferring said main signal component;
        a distortion injecting path for transferring said distortion component;
        a second variable attenuator, a second variable phase shifter and said auxiliary amplifier interposed in series with said distortion injecting path; and
        a power combiner for power-combining the outputs from said second delay line and said distortion injecting path to thereby cancel said distortion component in said main signal component with a distortion component amplified by said auxiliary amplifier and for outputting an amplified transmission signal contained in said main signal component.

2. A feed-forward multi-terminal-power-combining power amplifier comprising:
    a plurality of input terminals and a plurality of output terminals corresponding to a plurality of channels;

a plurality of feed-forward amplifier circuits each connected between the input terminal and output terminal of corresponding ones of said plurality of channels;

each of said feed forward amplifier circuits including:
   distortion detector circuit which comprises:
      a power divider for power-dividing transmission signal from the corresponding one of said input terminals and providing the transmission signals into a linear signal path and a main amplifier path and a main amplifier inserted in said main amplifier path for amplifying the transmission signal; and
      a power divider/combiner supplied with the outputs from said main amplifier path and said linear signal path, for power-dividing and combining said outputs and for outputting their sum and difference components as a main signal component and a distortion component, respectively;
   distortion canceller circuit provided with an auxiliary amplifier that amplifies said detected distortion component, for canceling said distortion component in said main signal by said amplified distortion component and for outputting said main signal to corresponding one of said output terminals;
   an input-side multi-terminal power combiner inserted in the main amplifier paths of all the distortion detector circuits on the input sides of said main amplifiers, for power-combining and dividing the transmission signals input to said main amplifier paths, for input to said main amplifiers; and
   an output-side multi-terminal power combiner inserted in the main amplifier paths of all the distortion detector circuits on the output sides of said main amplifiers, for power-combining and dividing the outputs from said main amplifiers, for output to said power-divider/combiners of all the distortion detector circuits.

3. The feed-forward multi-terminal power-combining power amplifier as claimed in claim 1, further comprising:
   first and second pilot signal generating means for generating first and second pilot signals;
   a first pilot signal coupler provided at the input side of said power amplifier in said each channel, for coupling said first pilot signal;
   a second pilot signal coupler inserted in said main amplifier path, for coupling said second pilot signal;
   a first pilot signal extractor inserted in said distortion injecting path;
   a second pilot signal extractor provided at the output side of said power combiner;
   first and second level detectors for detecting the levels of said first and second pilot signals extracted by said first and second pilot signal extractors;
   and control means for controlling said first variable attenuator and said first variable phase shifter to minimize the detected level of said first pilot signal and for controlling said second variable attenuator and said second variable phase shifter to minimize the detected level of said second pilot signal.

4. The feed-forward multi-terminal power-combining power amplifier as claimed in claim 2, wherein said distortion detector circuit of said feed-forward amplifier circuit of said each channel comprises:
   a first variable attenuator and a first variable phase shifter interposed in series with said main amplifier path; and
   wherein said distortion canceller circuit comprises:

a main signal path for transferring said main signal component;
   a distortion injecting path for transferring said distortion component;
   a second variable attenuator, a second variable phase shifter and said auxiliary amplifier interposed in series with said distortion injecting path; and
   a power combiner for power-combining the outputs from said main signal path and said distortion injecting path to thereby cancel said distortion component in said main signal component with a distortion component amplified by said auxiliary amplifier and for outputting an amplified transmission signal contained in said main signal component.

5. The feed-forward multi-terminal power-combining power amplifier as claimed in claim 4, further comprising: first and second pilot signal generating means for generating first and second pilot signals; a first pilot signal coupler provided at the input side of said power amplifier in said each channel, for coupling said first pilot signal; a second pilot signal coupler inserted in said main amplifier path, for coupling said second pilot signal; a first pilot signal extractor inserted in said distortion injecting path; a second pilot signal extractor provided at the output side of said power combiner; first and second level detectors for detecting the levels of said first and second pilot signals extracted by said first and second pilot signal extractors; and control means for controlling said first variable attenuator and said first variable phase shifter to minimize the detected level of said first pilot signal and for controlling said second variable attenuator and said second variable phase shifter to minimize the detected level of said second pilot signal.

6. The feed-forward multi-terminal power-combining power amplifier as claimed in claim 3, wherein: said first and second pilot signal generating means comprise first and second pilot signal generators provided for said each channel, for generating and applying said first and second pilot signals to said first and second pilot signal couplers of the corresponding channel; and said first and second level detecting means comprise first and second level detectors provided for said each channel, for detecting the levels of said first and second pilot signals.

7. The feed-forward multi-terminal power-combining power amplifier as claimed in claim 3 or 5, wherein: said first and second pilot signal generating means comprise first and second pilot signal generators provided in common to all of said channels, for generating said first and second pilot signals, and first and second switches for selecting said first and second pilot signal couplers of a desired channel and for applying said first and second pilot signals to said selected first and second pilot signal couplers; and said first and second level detecting means comprise third and fourth switches for selecting said first and second pilot signal extractors of a desired channel, and first and second level detectors provided in common to all of said channels, for detecting the levels of said first and second pilot signals from said first and second pilot signal extractors of said channel selected by said third and fourth switches.

8. The feed-forward multi-terminal power-combining power amplifier as claimed in claim 5, wherein said first and second pilot signal generating means comprise first and second pilot signal generators provided for said each channel, for generating and applying said first and second pilot signals to said first and second pilot signal couplers of the corresponding channel, and said first and second pilot signal couplers of the corresponding channel, said first and second level detecting means comprise first and second level detectors provided for each channel, for detecting the levels of said first and second pilot signals.

9. The feed-forward multi-terminal power-combining power amplifier as claimed in any one of claims 3, 4, 5, 1, 2, or 8, wherein said output ports of the respective channels are connected to a plurality of antenna elements forming an array antenna.

10. The feed-forward multi-terminal power-combining power amplifier as claimed in claim 9, wherein: said transmission signals are frequency-multiplexed signals; duplexers are interposed between said output ports of said respective channels and said array antenna elements, said antenna elements being connected via said duplexers to a plurality of receivers.

11. The feed-forward multi-terminal power-combining power amplifier as claimed in claim 9, wherein said transmission signals are time-multiplexed signals; switches are interposed between said output ports of said respective channels and said array antenna elements, said antenna elements being connected via said switches to a plurality of receivers.

* * * * *

UNITED STATES PATENT AND TRADEMARK OFFICE
CERTIFICATE OF CORRECTION

PATENT NO. : 6,515,544 B1 Page 1 of 1
DATED : February 4, 2003
INVENTOR(S) : Suzuki et al.

It is certified that error appears in the above-identified patent and that said Letters Patent is hereby corrected as shown below:

<u>Title page,</u>
Item [86], should read:
-- [86]  PCT No.:      PCT/JP00/06316

§ 371 (c)(1),
(2), (4) Date:   May 17, 2001 --

Signed and Sealed this

Third Day of June, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,515,544 B1  Page 1 of 1
APPLICATION NO. : 09/850733
DATED : February 4, 2003
INVENTOR(S) : Yasunori Suzuki et al.

It is certified that error appears in the above-identified patent and that said Letters Patent is hereby corrected as shown below:

On the Title Page, item 87, change "WO00/29410" to --WO01/22574--.

On the Title Page, item 87, change "May 25, 2000" to --March 29, 2001--.

Signed and Sealed this

Eighteenth Day of September, 2007

JON W. DUDAS
*Director of the United States Patent and Trademark Office*